United States Patent
Park et al.

(10) Patent No.: US 11,968,874 B2
(45) Date of Patent: Apr. 23, 2024

(54) ORGANIC LIGHT-EMITTING DISPLAY DEVICE INCLUDING QUANTUM DOTS

(71) Applicant: IUCF-HYU (Industry-University Cooperation Foundation Hanyang University), Seoul (KR)

(72) Inventors: Jea Gun Park, Seongnam-si (KR); Seung Jae Lee, Seoul (KR); Ji Eun Lee, Seoul (KR); Seo Yun Kim, Seoul (KR)

(73) Assignee: IUCF-HYU (Industry-University Cooperation Foundation Hanyang University), Seoul (KR)

( * ) Notice: Subject to any disclaimer, the term of this patent is extended or adjusted under 35 U.S.C. 154(b) by 170 days.

(21) Appl. No.: 16/963,096

(22) PCT Filed: May 26, 2020

(86) PCT No.: PCT/KR2020/006770
§ 371 (c)(1),
(2) Date: Jul. 17, 2020

(87) PCT Pub. No.: WO2021/020705
PCT Pub. Date: Feb. 4, 2021

(65) Prior Publication Data
US 2021/0408418 A1     Dec. 30, 2021

(30) Foreign Application Priority Data
Jul. 26, 2019   (KR) .......................... 10-2019-0091031

(51) Int. Cl.
*H10K 59/38*      (2023.01)
*G02B 5/20*       (2006.01)
(Continued)

(52) U.S. Cl.
CPC ............. *H10K 59/38* (2023.02); *G02B 5/20* (2013.01); *H10K 50/115* (2023.02); *H10K 59/12* (2023.02); *H10K 2102/331* (2023.02)

(58) Field of Classification Search
CPC ..................... H01L 27/322; H01L 2251/5369
See application file for complete search history.

(56) References Cited

U.S. PATENT DOCUMENTS

| | | | |
|---|---|---|---|
| 2007/0034833 A1* | 2/2007 | Parce .................... | C01B 19/007 252/301.36 |
| 2015/0041759 A1* | 2/2015 | Kahen .................... | H01L 33/06 438/47 |

(Continued)

FOREIGN PATENT DOCUMENTS

| CN | 105785642 A | 7/2016 |
|---|---|---|
| CN | 106684112 A | 5/2017 |

(Continued)

OTHER PUBLICATIONS

Ji-Eun Lee, Seung-Jae Lee, Yun-Hyuk Ko, Prabhakaran Prem, Kwang-Sup Lee and Jea-Gun Park, "High Stable Perovskite-Quantum-Dot Using Ligand Engineering for Liquid-Crystals-Display Applications", Mar. 2018, The Electrochemical Society, DO1—Nanoscale Luminescent Materials 5, 1144 (Year: 2018).*

(Continued)

*Primary Examiner* — Aaron J Gray
(74) *Attorney, Agent, or Firm* — NKL Law; Jae Youn Kim

(57) ABSTRACT

An organic light-emitting display device includes quantum dots and an RGB color filter layer having quantum dots and thus is capable of removing 100% of interference among red, green, and blue color filters.

4 Claims, 17 Drawing Sheets

(51) Int. Cl.
*H10K 50/115* (2023.01)
*H10K 59/12* (2023.01)
*H10K 102/00* (2023.01)

(56) References Cited

U.S. PATENT DOCUMENTS

| | | |
|---|---|---|
| 2015/0301408 A1 | 10/2015 | Li |
| 2016/0201858 A1 | 7/2016 | Cho et al. |
| 2017/0352714 A1 | 12/2017 | Choi et al. |
| 2019/0163016 A1* | 5/2019 | Kim ................. H01L 33/502 |
| 2020/0083303 A1* | 3/2020 | Bok .................. H10K 59/60 |
| 2020/0140701 A1* | 5/2020 | Jeon ................ C09D 5/1687 |
| 2020/0362240 A1 | 11/2020 | Yang et al. |

FOREIGN PATENT DOCUMENTS

| | | |
|---|---|---|
| CN | 107112350 A | 8/2017 |
| KR | 10-2016-0000811 A | 1/2016 |
| KR | 20160000811 A | 1/2016 |
| KR | 20170096583 A | 8/2017 |
| KR | 10-2018-0040173 A | 4/2018 |
| KR | 10-2018-0054329 A | 5/2018 |
| KR | 10-1900775 B1 | 9/2018 |
| KR | 20180101302 A | 9/2018 |
| KR | 10-2019-0007294 A | 1/2019 |
| KR | 20190007294 A | 1/2019 |
| KR | 10-2019-0032017 A | 3/2019 |
| KR | 20190032017 A | 3/2019 |
| KR | 10-2019-0042192 A | 4/2019 |
| KR | 10-2181062 B1 | 11/2020 |
| TW | 201835295 A | 10/2018 |

OTHER PUBLICATIONS

J.E. Lee, et al. High Resolution OLED Using Eco-Friendly Quantum-Dots Functional Color-Filter, Abstract #882, 235th ECS Meeting, May 28, 2019, The Electrochemical Society.

* cited by examiner

ORGANIC LIGHT-EMITTING DISPLAY DEVICE INCLUDING QUANTUM DOTS

CROSS-REFERENCE TO RELATED APPLICATIONS

This application is a National Stage Entry of PCT International Application No. PCT/KR2020/006770, which was filed on May 26, 2020, and which claims priority to Korean Patent Application No. 10-2019-0091031, filed on Jul. 26, 2019, in the Korean Intellectual Property Office, the disclosures of which are incorporated herein by reference.

TECHNICAL FIELD

The present invention relates to an organic light-emitting display device including quantum dots, and more particularly, an organic light-emitting display device including an RGB color filter layer that includes quantum dots and thus is capable of removing 100% of interference among red, green, and blue color filters.

BACKGROUND ART

With the advent of the information society, the importance of video display devices as delivery media that provide various information to users is being emphasized day by day. Thereamong, with regard to rapidly developing semiconductor technology, a display device that is miniaturized and weight-reduced and is provided with a liquid crystal display (LCD) panel with further improved performance is being considered as a representative display device.

Since a display device provided with an LCD panel allows miniaturization, weight reduction, low power consumption, and the like, it has gradually attracted attention as an alternative means for overcoming disadvantages of existing cathode ray tubes (CRT). Such a display device is currently mounted and used in almost all information processing devices including medium/large products such as monitors and TVs as well as small products such as mobile phones, personal digital assistants (PDA), and portable multimedia players (PMP).

Recently, a technique of applying a quantum dot-improving film including quantum dots to a backlight to compensate for a decrease in luminance of a liquid crystal display device is being studied.

Unlike a bulk matter, nanoparticles can adjust physical properties (energy bandgap, melting point, etc.), which are known to be intrinsic properties of materials, according to particle size. For example, semiconductor nanocrystals, which are also called quantum dots and are semiconductor materials having a crystal structure of several nanometers in size, are very small, thereby having a large surface area per unit volume and exhibiting a quantum confinement effect. Accordingly, semiconductor nanocrystals have physico-chemical properties different from those of a semiconductor material itself. Quantum dots absorb light from an excitation source to enter an energy excitation state, and emit energy corresponding to the energy band gap of the quantum dots.

Quantum dots have a theoretical quantum yield (QY) of 100% and can emit light of high color purity (e.g., a full width at half maximum (FWHM) of 40 nm or less), and can achieve increased luminous efficacy and improved color reproduction. Accordingly, research is being actively conducted to apply quantum dots to various electronic devices such as liquid crystal display devices, various display devices such as organic light emitting display devices, image sensors, and lighting devices. However, there is still a need for electronic devices that include quantum dots exhibiting improved properties.

Korean Patent Publication Application No. 10-2018-0040173 discloses a photoelectric conversion layer including first quantum dots, which emit red light, and second quantum dots, which emit green light, to emit green light and red light, thereby being capable of improving the luminescent property of a liquid crystal display device and color reproducibility. However, since film formation is performed using a resin to form a photoelectric conversion layer, the transmittance of a resin used for film formation is ~90%, resulting in a backlight light source energy loss of ~10%. In addition, such a technology is limited to a blue backlight-based LCD technology, so there are limitations in applying to flexible displays and LCD technology.

Korean Patent Publication Application No. 10-2019-0007294 discloses a color filter including quantum dots that emit light having a longer wavelength than the wavelength of light emitted by color particles. This technology is based on a white organic light emitting device (OLED), and a white OLED includes a blue peak and a yellow peak. The yellow peak spectrum energy widely spreads, so that cross talk between green light and red light finally occurs in the form of wide green and red peak spectra. Accordingly, color reproducibility is decreased. In addition, while a white OLED can absorb blue and yellow spectrum energy, and red quantum dots can absorb blue and yellow band energy, an energy absorption region of green quantum dots and blue quantum dots is reduced, resulting in backlight light source loss.

DISCLOSURE

Technical Problem

Therefore, the present invention has been made in view of the above problems, and it is one object of the present invention to provide an organic light-emitting display device that includes red, green and blue color filters including zincblende quantum dots to remove interference among red light, green light and blue light and, accordingly, have a wide RGB color gamut value (~100% achievable based on the BT.2020 a color standard).

It is another object of the present invention to provide an organic light-emitting display device manufactured by mixing quantum dots with an RGB color filter layer, instead of manufacturing quantum dots using a backlight or a functional film, thereby being capable of addressing light source loss (~10%) and realizing process simplification and device slimness due to omission of a film formation process.

Technical Solution

In accordance with an aspect of the present invention, the above and other objects can be accomplished by the provision of an organic light-emitting display device, including a lower substrate including a driving transistor formed on a surface thereof; an organic light-emitting element interlocked with the driving transistor; and an RGB color filter layer formed on the organic light-emitting element and provided with quantum dots that absorb light and emit the absorbed light in a form of visible light in a specific wavelength range.

The organic light-emitting element may be a blue organic light-emitting diode (OLED) The quantum dots may energy-down-shift light incident from the organic light emitting element.

The quantum dots may include a zincblende structure.

The quantum dots may include at least one of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs and a combination thereof.

The quantum dots may include at least one of a core/single shell structure, a core/multi-shell structure and an alloy structure.

The quantum dots may include blue quantum dots having a core/shell structure of ZnSe/ZnS.

The quantum dots may include green quantum dots having a core/shell structure of InP/ZnSe/ZeSnS/ZnS.

The quantum dots may include red quantum dots having a core/shell structure of InP/ZnSe/ZnS.

An absorption of the color filter layer may be adjusted according to a concentration of the quantum dots.

Advantageous Effects

According to an embodiment of the present invention, provided is an organic light-emitting display device that includes red, green and blue color filters including zincblende quantum dots to remove interference among red light, green light and blue light and, accordingly, have a wide RGB color gamut value (~100% achievable based on the BT.2020 a color standard).

According to an embodiment of the present invention, provided is an organic light-emitting display device manufactured by mixing quantum dots with an RGB color filter layer, instead of manufacturing quantum dots using a backlight or a functional film, thereby being capable of addressing light source loss (~10%) and realizing process simplification and device slimness due to omission of a film formation process.

BEST MODE

Figure 1A:
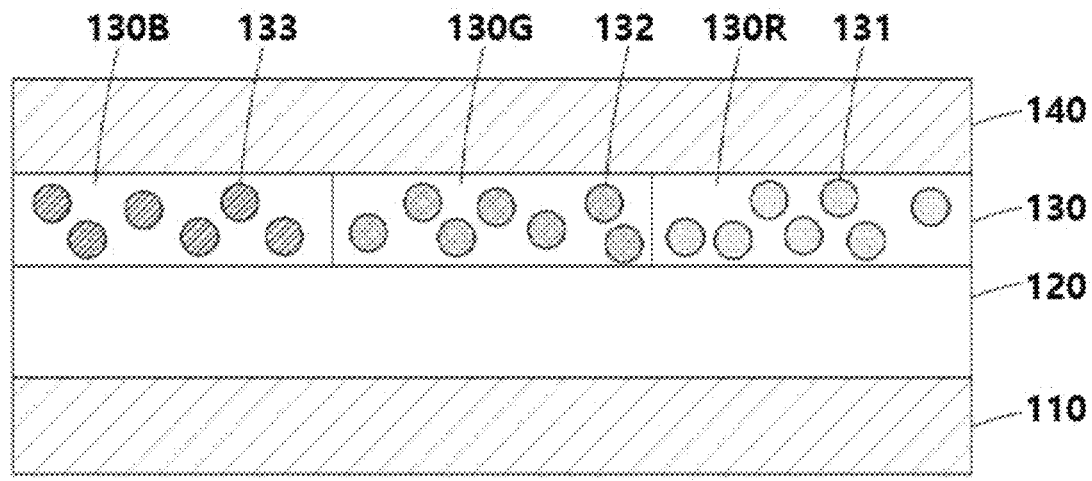
FIGS. 1A and 1B are sectional views illustrating components of an organic light-emitting display device according to an embodiment of the present invention.

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In addition, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

Hereinafter, an embodiment of the present invention is described in detail with reference to the accompanying drawings.

Figure 1B:
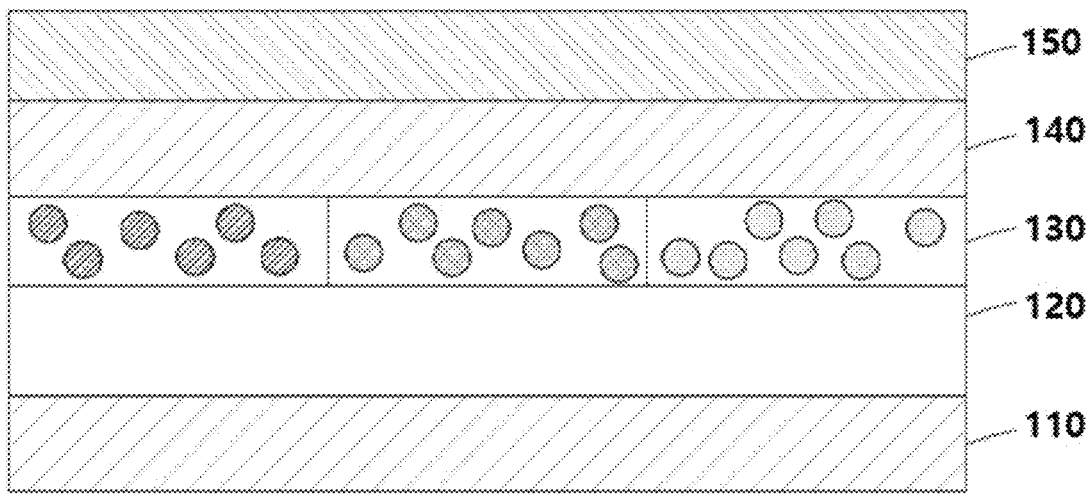

FIGS. 1A and 1B illustrate an organic light-emitting display device according to an embodiment of the present invention.

The organic light-emitting display device according to an embodiment of the present invention includes a lower substrate 110 including a driving transistor formed on a surface thereof; an organic light-emitting element 120 connected to the driving transistor; an RGB color filter layer 130 that is formed on the organic light-emitting element 120 and includes quantum dots 131, 132, and 133 to absorb light incident from the organic light emitting device 120 and emit a specific wavelength band of light; and an upper substrate 140 formed on the RGB color filter layer 130 to seal the organic light-emitting element 120.

The organic light-emitting display device according to an embodiment of the present invention includes the lower substrate 110 on a surface of which a driving transistor is formed.

The lower substrate 110 includes pixels composed of the driving transistor TR and organic light-emitting element 120 formed on an upper surface thereof, the upper substrate 140 is disposed to face the lower substrate 110, and the lower substrate 110 and the upper substrate 140 are connected to each other by a coupling member.

The driving transistor TR may include a plurality of transistors for supplying current to the organic light-emitting element 120, the driving transistor TR may be formed in a transistor region on the lower substrate 110, and the organic light-emitting element 120 may be formed in a display region on the lower substrate 110.

The driving transistor TR may include an active layer, a source electrode, a drain electrode, a gate insulating layer and a gate electrode.

The organic light-emitting element 120 emitting by a driving current applied through the driving transistor TR may be formed in a display region defined by a bank on the driving transistor TR.

The organic light-emitting display device according to an embodiment of the present invention includes the organic light-emitting element 120 connected to a driving transistor.

The organic light-emitting element 120 may include a first electrode, a second electrode and a light-emitting layer formed between the first electrode and the second electrode. The first and the second electrodes may be positive or negative electrodes.

According to an embodiment, at least one of a hole transport layer, a hole injection layer, an electron transport layer and an electron injection layer may be formed between the first electrode, the second electrode and the light-emitting layer of the organic light-emitting element.

For example, holes generated in the first electrode and electrons generated in the second electrode are injected into the light-emitting layer of the organic light-emitting element 120, and the injected electrons and holes are combined to generate excitons. The generated excitons generate unique color light upon dropping from an excited state to a ground state, thereby displaying a color image.

The organic light-emitting element 120 may be a blue OLED using blue light as a light source. A white OLED is manufactured by mixing a yellow phosphor with blue and thus exhibits a wide FWHM, resulting in energy loss from a light source. On the other hand, in the case of the blue OLED using a blue light source according to an embodiment of the present invention, the RGB color filter layer 130 including the quantum dots 131, 132, and 133 absorbs a blue light source and thus causes energy-down shift to generate RGB light, thereby reducing energy loss.

The organic light-emitting element 120 may be a blue OLED using blue light as a light source and may include $MoO_3$ (10 nm)/NPB (60 nm)/BCzVBi 5 wt %: CBP: TPBi (1:1, 20 nm)/TPBi (40 nm)/LiF (1 nm)/Al (150 nm). Here, HOMO of NPB is 2.1 eV, LUMO is 5.0, HOMO of BCzVBi is 2.4 eV, LUMO is 5.5, HOMO of CPB is 2.9 eV, LUMO is 6.0, HOMO of TPBi is 2.7 eV, and LUMO is 6.2.

The organic light-emitting display device according to an embodiment of the present invention includes the RGB color filter layer 130 that is formed on the organic light-emitting element 120 and includes the quantum dots 131, 132, and 133 that absorb light incident from the organic light emitting device 120 to emit light in a specific wavelength band.

The quantum dots 131, 132, and 133 may energy-down-shift light incident from the organic light emitting element. The quantum dots 131, 132, and 133 may energy-down shift light incident from a light source to emit red light, green light and blue light corresponding to the RGB color filter layer 130.

More particularly, since a semiconductor material including the quantum dots 131, 132, and 133 can absorb photon energy above bandgap energy, all of the quantum dots 131, 132, and 133 can absorb a blue light source, and emission wavelengths corresponding to bandgap energy of the quantum dots 131, 132, and 133 are emitted, so that RGB colors may be expressed.

Accordingly, since the RGB color filter layer 130 of the organic light-emitting display device according to an embodiment of the present invention includes the quantum dots 131, 132, and 133, it absorbs high photon energy and emits light corresponding to low photo bandgap energy, thereby being capable of energy-down shifting light.

The quantum dots 131, 132, and 133 may include zincblende quantum dots including a zincblende structure.

Zincblende quantum dots may absorb light incident from a light source by adjusting a stoichiometric molar fraction, and then energy-down shift light, thereby emitting only red light, green light and blue light.

Accordingly, the organic light-emitting display device according to an embodiment of the present invention may have a narrow FWHM and may emit red light, green light and blue light without crosstalk in a color filter state.

In addition, in the case of the organic light-emitting display device according to an embodiment of the present invention, since zincblende quantum dots are mixed with the RGB color filter layer 130 instead of using zincblende quantum dots to manufacture a backlight or a functional film, light loss (~10%) of a light source may be addressed and a film formation process may be omitted, thereby being capable of realizing process simplification and device slimness.

The RGB color filter layer 130 may include a red color filter 130R, a green color filter 130G and a blue color filter 130B. The red color filter 130R may include first quantum dots 131 absorbing light incident from a light source to emit red light, the green color filter 130G may include second quantum dots 132 absorbing light incident from a light source to emit green light, and the blue color filter 130B may include third quantum dots 133 absorbing light incident from a light source to emit blue light.

Absorption of the RGB color filter layer 130 may be controlled according to the concentration of quantum dots.

In particular, absorption may increase with increasing concentrations of the quantum dots 131, 132, and 133, and saturation absorption may be exhibited when the concentrations of the quantum dots 131, 132, and 133 reach a critical concentration. However, when the concentrations of the quantum dots 131, 132, and 133 are greater than a critical concentration, a luminous efficiency of light emitted by the quantum dots 131, 132, and 133 scattered around the quantum dots 131, 132, and 133 may be reduced due to the self-reabsorption effect.

In the case of the quantum dots 131, 132, and 133, a blue light source is absorbed, and light corresponding to each RGB color filter layer 130 is emitted and passes through the RGB color filter layer 130.

In the case of spectral peak wavelengths of the RGB color filter layer 130, blue is 450 nm, green is 530 nm, and red is 620 nm. The peak wavelengths of the RGB color filter layer 130 coincide with the peak wavelengths of the quantum dots 131, 132, and 133, so that RGB light may be emitted without energy loss.

Accordingly, so as to adjust blue to 445 to 450 nm, green to 520 to 530, and red to 625 to 640 nm in peak wavelengths of the quantum dots 131, 132, and 133, the composition of the quantum dots 131, 132, and 133 may be adjusted and thus the structure thereof may be controlled.

A surface of the quantum dots 131, 132, and 133 may include an encapsulation layer. More particularly, the quantum dots 131, 132, and 133 may be core-shell structured quantum dots, cores of which include zincblende quantum dots and shells of which include an encapsulation layer.

Since the RGB color filter layer 130 of the organic light-emitting display device according to an embodiment of the present invention includes core-shell structured quantum dots, zincblende quantum dots corresponding to cores are not exposed to the air, thereby being capable of improving the durability of the zincblende quantum dots.

The encapsulation layer may be silica (SiO2), zinc sulfide (ZnS) or zinc-selenium-sulfur (ZnSeS) alloy.

In addition, according to an embodiment, ligands are formed on surfaces of the quantum dots 131, 132, and 133 of the organic light-emitting display device according to an embodiment of the present invention, thereby being capable of improving the stability of the quantum dots 131, 132, and 133. For example, the ligands may be made of perfluorooctanoic acid (PFOA).

Accordingly, since the organic light-emitting display device according to an embodiment of the present invention uses the red color filter 130R, green color filter 130G and blue color filter 130B including quantum dots, interference among red light, green light and blue light is removed, thereby being capable of having a wide RGB color gamut value (~100% achievable based on the BT.2020 color standard).

The quantum dots 131, 132, and 133 included in the RGB color filter layer 130 of the organic light-emitting display device according to an embodiment of the present invention may be non-zincblende quantum dots, not zincblende quantum dots, and components of the RGB color filter layer 130 including non-zincblende quantum dots are the same as those of the RGB color filter layer 130 including zincblende quantum dots except that non-zincblende quantum dots are used as the quantum dots 131, 132, and 133.

Accordingly, the quantum dots of the organic light-emitting device according to an embodiment of the present invention may include zincblende quantum dots or non-zincblende quantum dots or both zincblende quantum dots and non-zincblende quantum dots. The quantum dots of the present invention may include quantum dots consisting of group 12 and 16 elements such as CdSe, CdSeS, ZnSe, ZnTe, ZnTeS, quantum dots consisting of group 13 and 15 elements such as ZnSe, InP, InGaP, InAlP, and GaP, or perovskite quantum dots, or quantum dots consisting of a combination thereof.

More particularly, the quantum dots may include at least one of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs and a combination thereof.

More particularly, the first quantum dots 131, which absorb light incident from a light source and emit red light, of the RGB color filter layer 130 may have a core-shell structure composed of a core/inter-shell/outer-shell. The bandgap energy of the core may be 1.99 eV, the bandgap energy of the inter-shell may be 2.71 to 3.68 eV, and the bandgap energy of the outer-shell may be 3.68 eV. The first quantum dots 131 may consist of InP/ZnSe/ZnS.

More particularly, the second quantum dots 132, which absorb light incident from a light source and emit green light, of the RGB color filter layer 130 may have a core-shell structure composed of a core/inter-shell/outer-shell. The bandgap energy of the core may be 2.34 eV, the bandgap energy of the inter-shell may be 2.71 to 0.68 eV, and the bandgap energy of the outer-shell may be 3.68 eV. The second quantum dots 132 may consist of InP/ZnSe/ZnSeS/ZnS.

More particularly, the third quantum dots 133, which absorb light incident from a light source and emit blue light, of the RGB color filter layer 130 may have a core-shell structure composed of a core/outer-shell. The bandgap energy of the core may be 2.79 eV and the bandgap energy of the outer-shell may be 3.68 eV. The third quantum dots 133 may consist of ZnSe/ZnS.

The organic light-emitting display device according to an embodiment of the present invention is formed on the RGB color filter layer 130 and includes the upper substrate 140 for sealing the organic light-emitting element 120.

The upper substrate 140 formed on the RGB color filter layer 130 serves to seal the organic light-emitting element 120 from external factors such as moisture.

The organic light-emitting display device according to an embodiment of the present invention may include a polarizer 150 formed on the upper substrate 140.

The polarizer 150 formed on the upper substrate 140 serves to polarize light incident from the organic light-emitting element 120 to provide uniform luminance distribution. The polarizer 150 may be a vertical polarizer or a horizontal polarizer.

Hereinafter, the present invention will be described in more detail with reference to the following Examples. It will be apparent to those skilled in the art that the Examples are merely for concretely explaining the invention and therefore, there is no intent to limit the invention to the Examples.

Manufacturing Example 1. Zincblende Quantum Dot Synthesis

Manufacture of First Quantum Dots (InP/ZnSe/ZnS)

0.65 mmol of indium acetate, 15 mL of 1-octadecene (ODE) and 1.95 mmol of palmitic acid (PA) were fed into a 100 mL 3-neck flask, followed by heating at 150° C. under vacuum. After 1 hour, the atmosphere in the reactor was replaced with nitrogen ($N_2$). After heating at 300° C., 0.325 mmol of a tris(trimethylsilyl)phosphine (TMS3P) solution was rapidly injected and reaction was allowed to proceed, thereby forming InP cores. Subsequently, shells were continuously formed. To form ZnSe/ZnS shells, 3 mmol of zinc stearate was rapidly injected into 10 mL of a mixed 1-octadecene solution and reaction was allowed to proceed for 30 minutes. Next, 0.5 ml of 1.6 M Se-TOP was injected and reaction was allowed to proceed for 30 minutes. Continuously, 2 ml of 2 M S-TOP was injected and ZnSe/ZnS shells were allowed to form for 120 minutes. After terminating the reaction, the quantum dot solution was rapidly cooled at room temperature and ethanol was added thereto, so that precipitates were formed. The precipitates were separated by centrifugation and re-dispersed in hexane or toluene.

Manufacture of Second Quantum Dots (InP/ZnSe/ZnSeS/ZnS)

0.4 mmol of indium acetate, 0.2 mmol of zinc acetate, 10 mL of 1-octadecene (ODE) and 1.4 mmol of palmitic acid (PA) were fed into a 100 mL 3-neck flask, followed by heating at 150° C. under vacuum. After 1 hour, the atmosphere in the reactor was replaced with nitrogen (N2). After heating at 320° C., 0.175 mmol of a tris(trimethylsilyl)phosphine (TMS3P) solution was rapidly injected and reaction was allowed to proceed, thereby forming InP cores. Subsequently, shells were continuously formed. To form ZnSe/ZnSeS/ZnS shells, 6 mmol of zinc stearate was rapidly injected into 15 mL of a mixed 1-octadecene solution and reaction was allowed to proceed for 30 minutes. Next, 0.3 ml of 1.6 M Se-TOP was injected and reaction was allowed to proceed for 30 minutes. Continuously, 0.1 ml of 1.6 M Se-TOP and 0.5 ml of 2 M S-TOP were injected and allowed to react for 30 minutes. 2 ml of 2 M S-TOP was injected thereto and was allowed to react for 30 minutes, thereby forming ZnSe/ZnSeS/ZnS shells. After terminating the reaction, the quantum dot solution was rapidly cooled at room temperature and ethanol was added thereto, so that precipitates were formed. The precipitates were separated by centrifugation and re-dispersed in hexane or toluene.

Manufacture of Third Quantum Dots (ZnSe/ZnS)

1.0 mmol of zinc acetate, 20 mL of 1-octadecene (ODE) and 2 mmol of oleic acid (OA) were fed into a 100 mL 3-neck flask, followed by heating at 150° C. under vacuum. After 1 hour, the atmosphere in the reactor was converted into nitrogen (N2). After heating at 320° C., 1.0 ml of a 1 M Se-TOP solution was rapidly injected and reaction was allowed to proceed, thereby forming ZnSe cores. Continuously, shells were formed. 2 mmol of zinc oleate was rapidly injected into 2 mL of a mixed 1-octadecene solution, and then 2 ml of 2 M S-TOP was continuously injected, followed by allowing ZnS shells to grow for 120 minutes. After terminating the reaction, the quantum dot solution was rapidly cooled at room temperature and ethanol was added thereto, so that precipitates were formed. The precipitates were separated by centrifugation and re-dispersed in hexane or toluene.

Manufacturing Example 2. Manufacture of RGB Color Filter Layer Including Quantum Dots Zincblende quantum dots manufactured according to Manufacturing Example 1 were dissolved in a 20 wt % solvent (hexane) to prepare a quantum dot solution. The quantum dot solution was mixed with 0.3 mL of red, green and blue color filters (DCR-TR711R, DCR-TR711G and DCR-TR711B, manufactured by DONGJIN SEMICHEM CO LTD.) in a 5 mL glass vial, thereby preparing red, green and blue zincblende quantum dot solutions.

A quartz glass substrate was cleaned by ultrasonication in isopropanol and acetone (1:1) for 100 minutes, and then dried in the presence of nitrogen. Next, 1 cm$^2$ of the quartz glass substrate was uniformly coated with each of the red, green and blue zincblende quantum dot solutions, and then dried at room temperature.

Figure 2A:
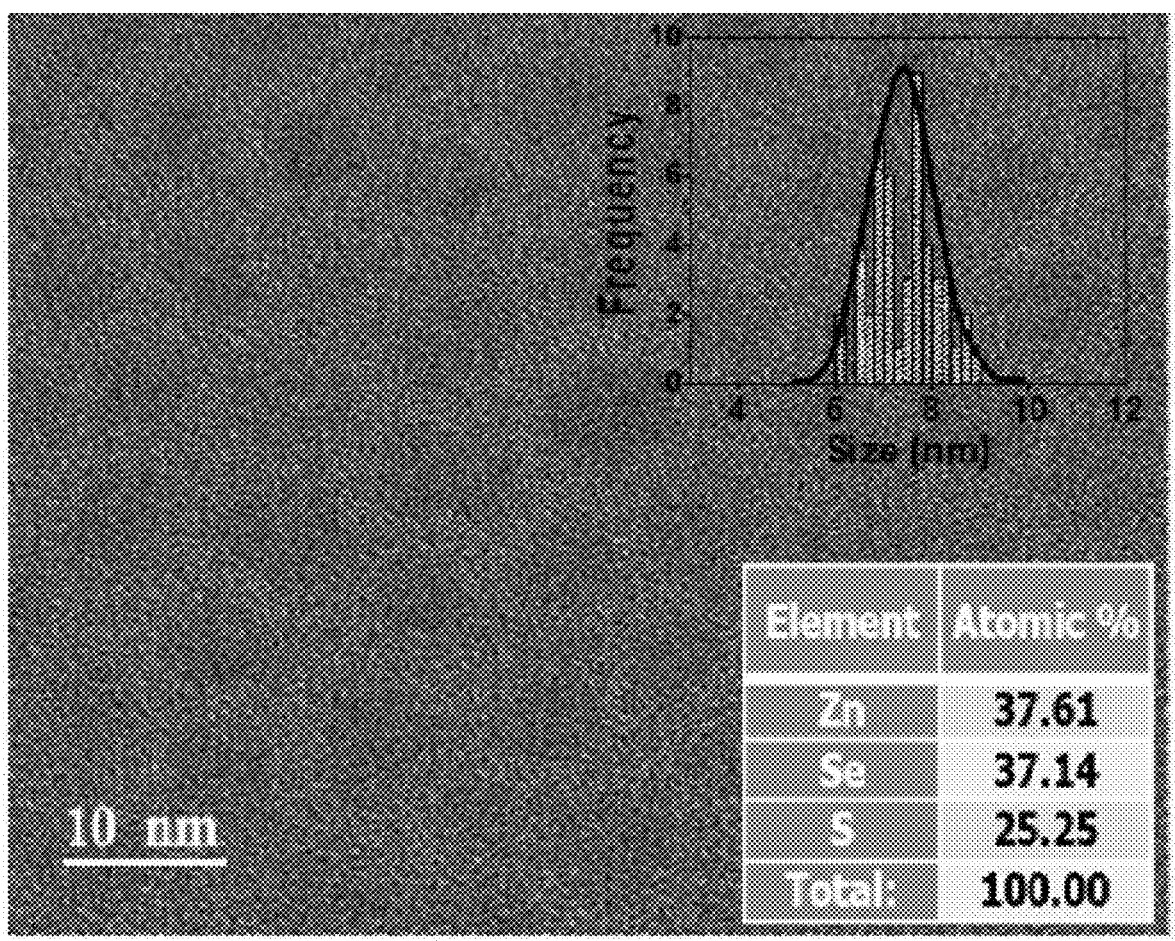
FIGS. 2A to 2C illustrate images of blue zincblende quantum dots (ZnSe/ZnS) (FIG. 2A), green zincblende quantum dots (InP/ZnSe/ZnSeS/ZnS) (FIG. 2B) and red zincblende quantum dots (InP/ZnSe/ZnS) (FIG. 2C) measured using a high resolution transmission electron microscope (HR-TEM) according to an embodiment of the present invention.
Figure 2B:
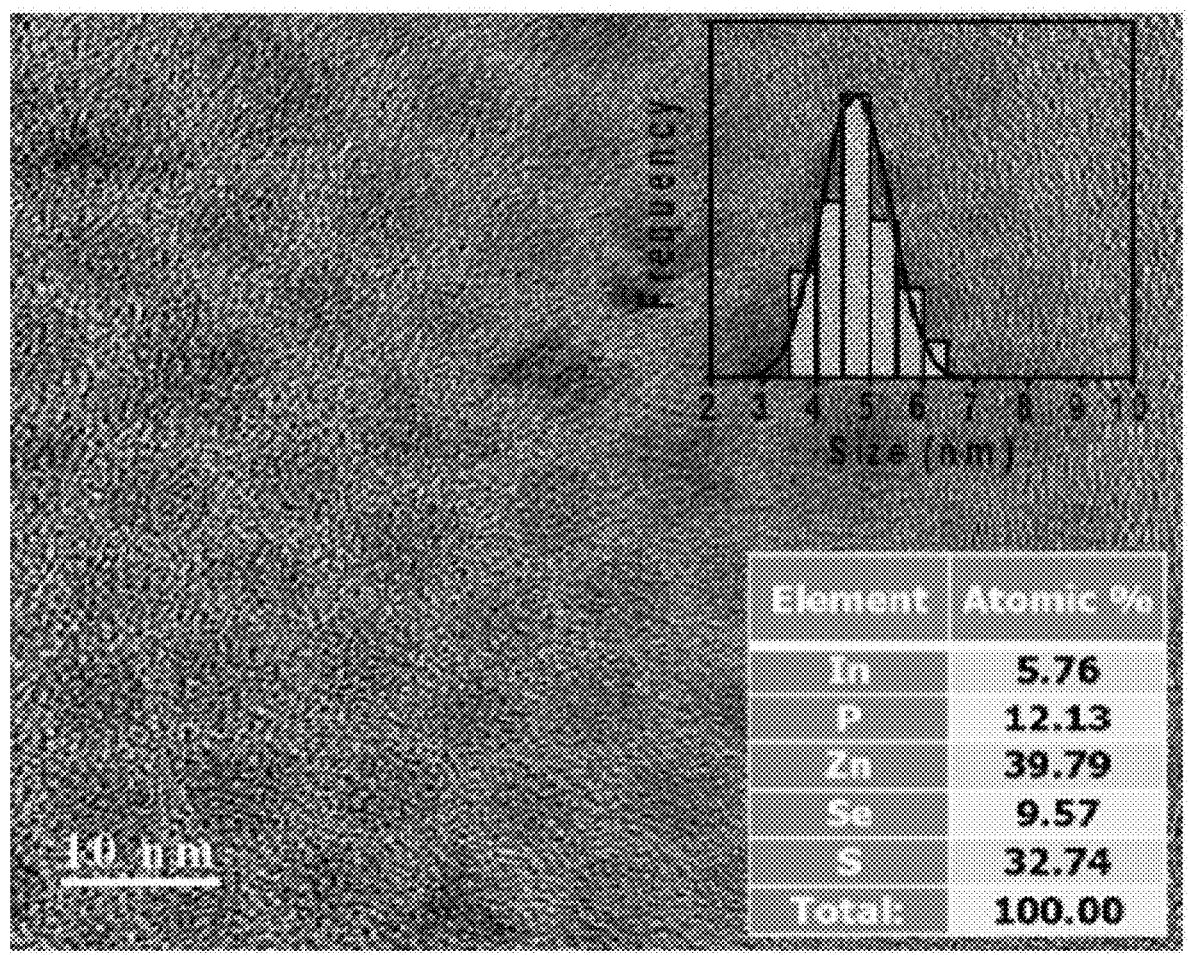
Figure 2C:
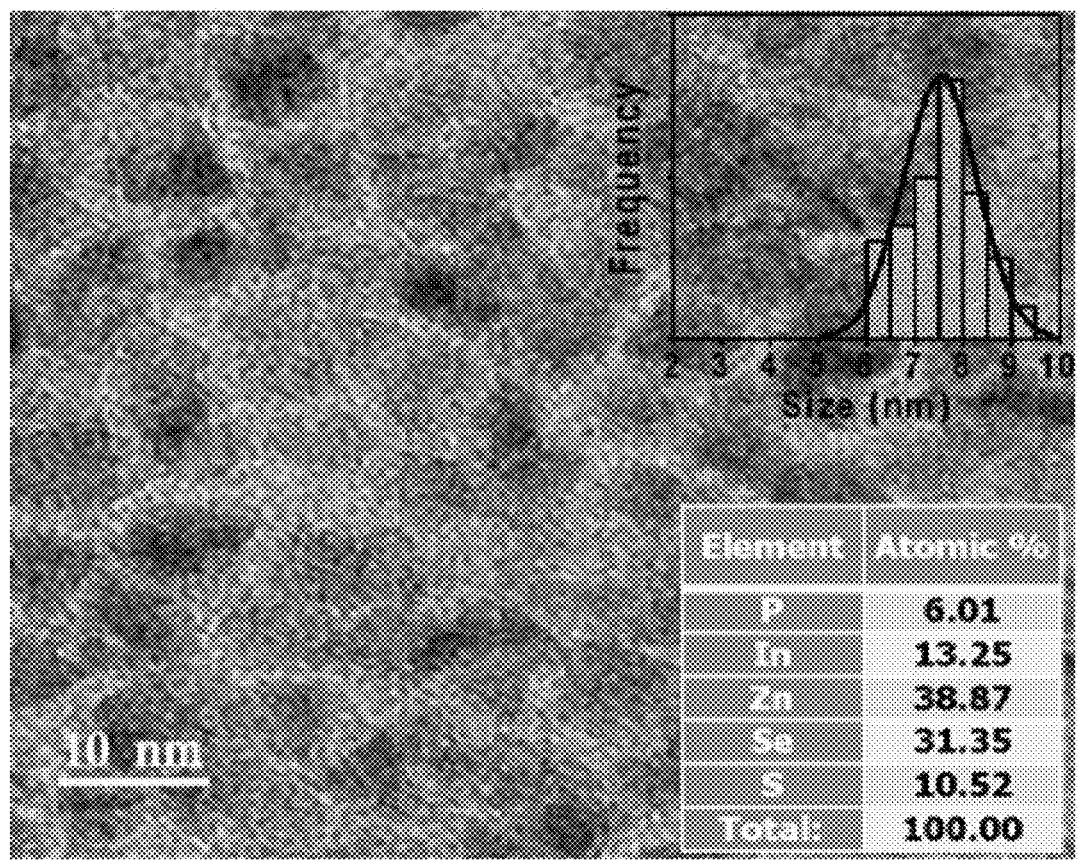

Images of the blue zincblende structure quantum dots, green zincblende structure quantum dots, and red zincblende structure quantum dots according to an embodiment of the present invention were analyzed using high-resolution transmission electron microscopy (HR-TEM). FIG. 2A illustrates a high resolution transmission electron microscope image of the blue zincblende quantum dots (ZnSe/ZnS), FIG. 2B illustrates a high resolution transmission electron microscope image of the green zincblende quantum dots (InP/ZnSe/ZnSeS/ZnS), and FIG. 2C illustrates a high resolution transmission electron microscope image of the red zincblende quantum dots (InP/ZnSe/ZnS). Referring to FIGS. 2A to 2C, it can be confirmed that the blue, green and red zincblende quantum dots were formed.

Figure 3A:
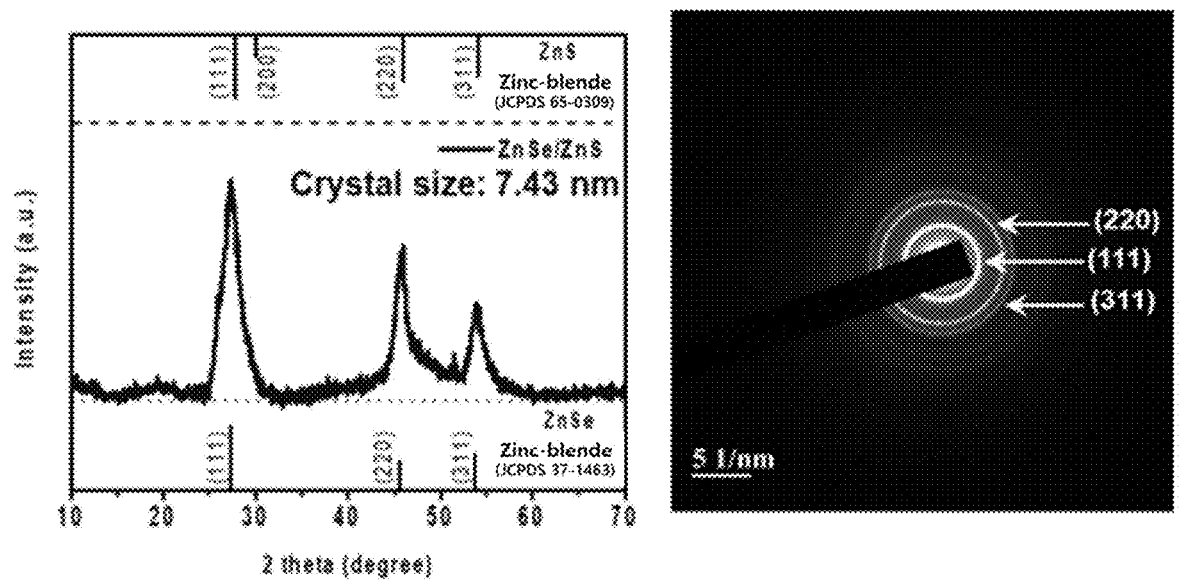
FIGS. 3A to 3C illustrate XRD analysis results and SAED images of blue zincblende quantum dots (ZnSe/ZnS) (FIG. 3A), green zincblende quantum dots (InP/ZnSe/ZnSe S/ZnS) (FIG. 3B) and red zincblende quantum dots (InP/ZnSe/ZnS) (FIG. 3C).
Figure 3B:
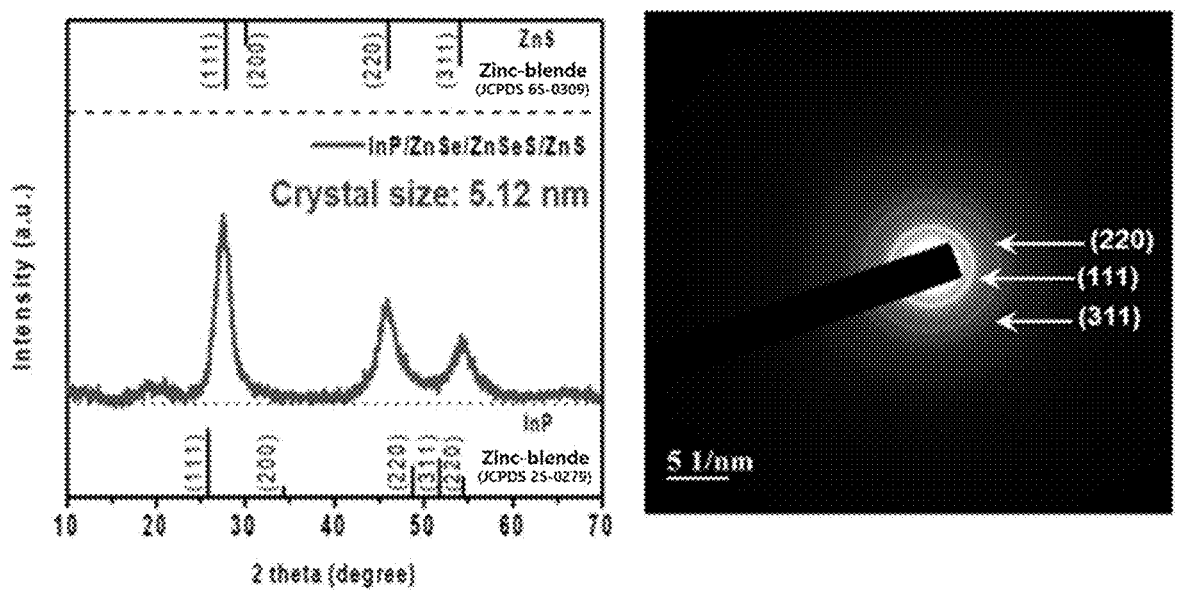
Figure 3C:
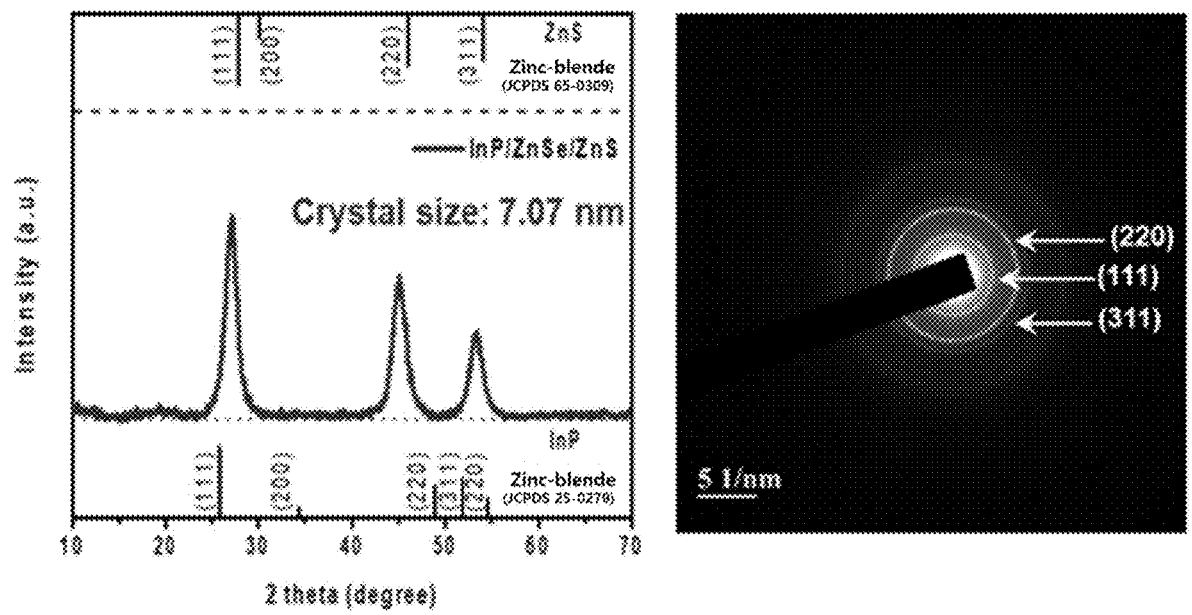

FIG. 3A illustrates an XRD analysis result and SEAD image of the blue zincblende quantum dots (ZnSe/ZnS), FIG. 3B illustrates an XRD analysis result and SEAD image of the green zincblende quantum dots (InP/ZnSe/ZnSeS/ZnS), and FIG. 3C illustrates an XRD analysis result and SEAD image of the red zincblende quantum dots (InP/ZnSe/ZnS). Referring to FIGS. 3A to 3C, it can be confirmed that crystal sizes of the blue, green and red zincblende quantum dots are respectively 7.43 nm, 5.12 nm and 7.07 nm.

Figure 4A:
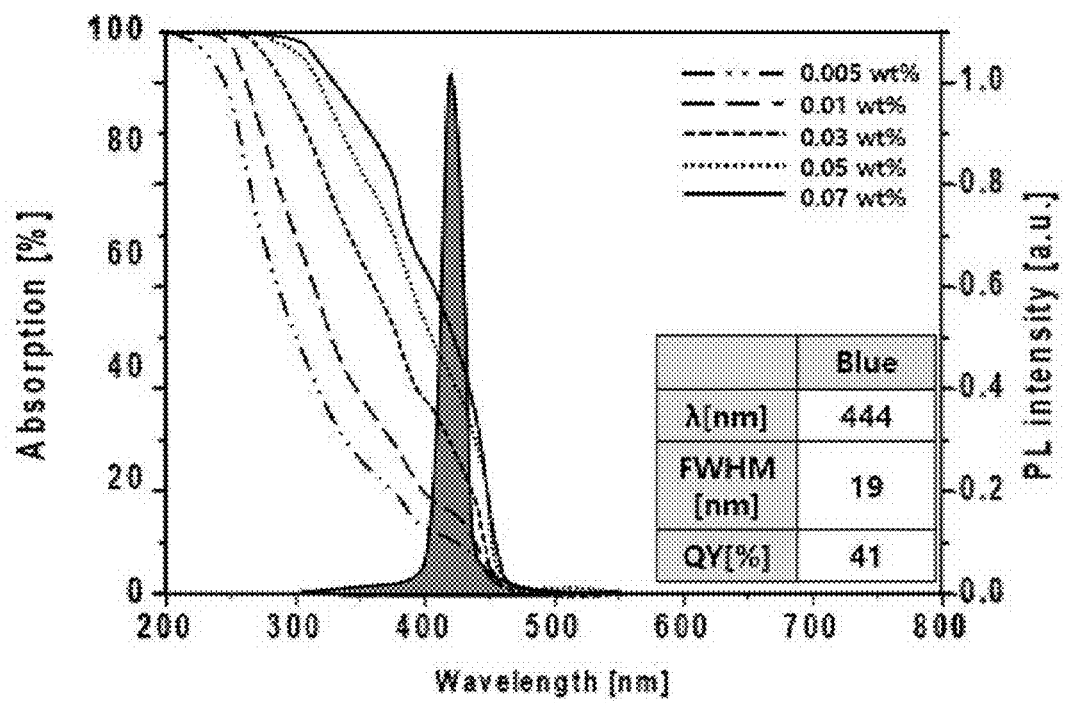
FIGS. 4A to 4C illustrate absorption and photoluminescence (PL, 0.005 to 0.07 wt %, under 325 nm wavelength) measurement results of blue (FIG. 4A), green (FIG. 4B) and red (FIG. 4C) zincblende quantum dots.
Figure 4B:
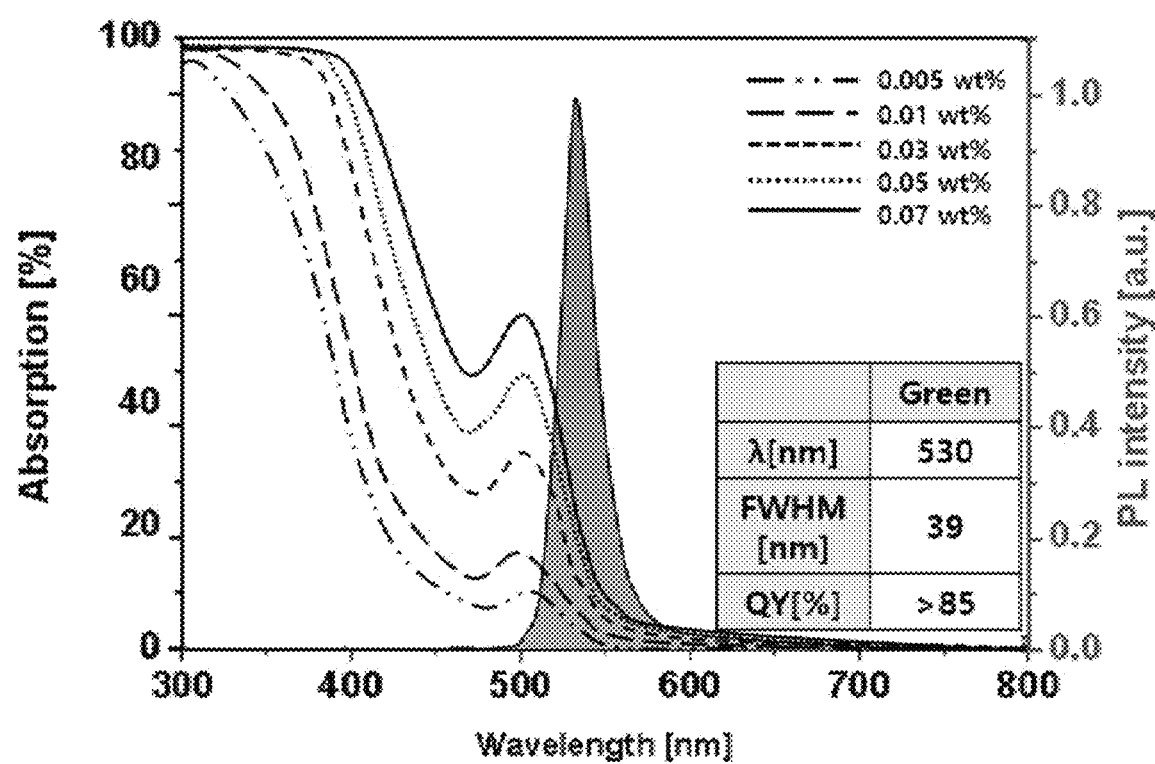
Figure 4C:
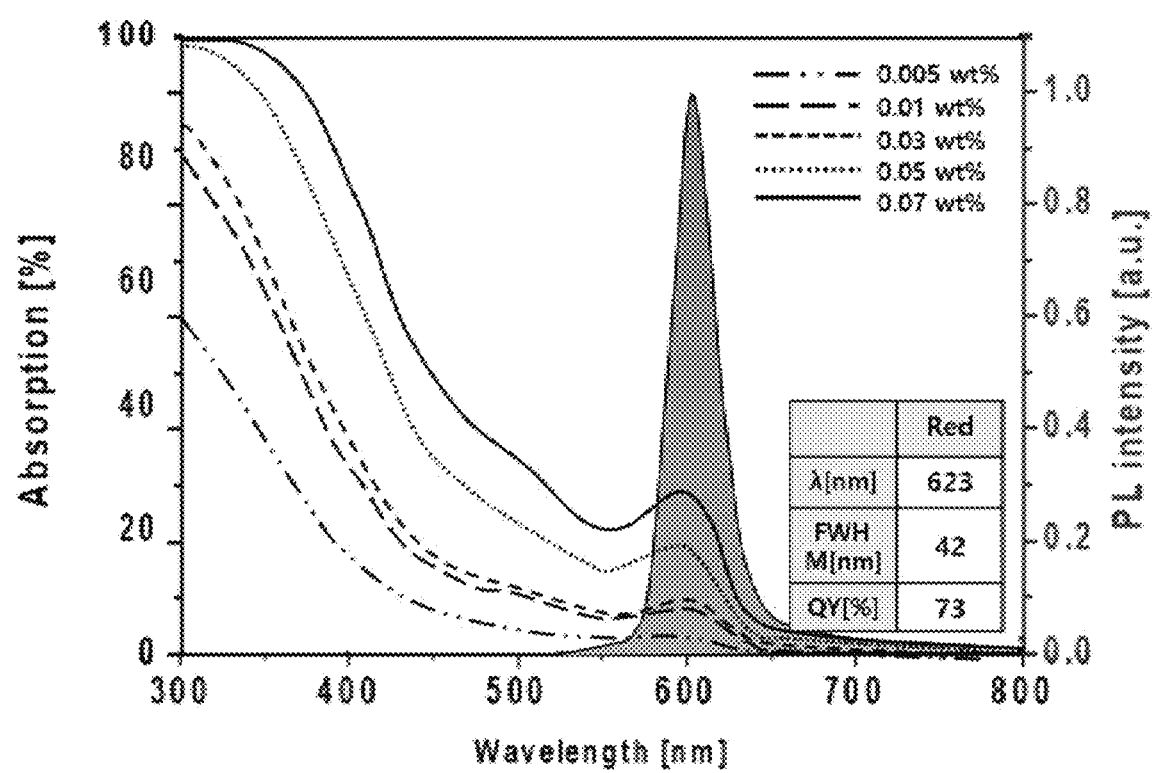

FIG. 4A illustrates absorption and photoluminescence (PL, 0.005 to 0.07 wt %, under 325 nm wavelength) measurement results of the blue zincblende quantum dots, FIG. 4B illustrates absorption and photoluminescence measurement results of the green zincblende quantum dots, and FIG. 4C illustrates absorption and photoluminescence measurement results of the red zincblende quantum dots.

Referring to FIG. 4A, the blue zincblende quantum dots absorbed light having wavelengths of 300 to 500 nm, and absorption of the blue zincblende quantum dots increased with increasing concentration (wt %) of the blue zincblende quantum dots when measured by UV-visible spectroscopy. In the case of the blue zincblende quantum dots, PL was 444 nm, FWHM was 19 nm, and photoluminescence-quantum yield (PL-QY) was 41%.

Referring to FIG. 4B, the green zincblende quantum dots absorbed light having wavelengths of 300 to 550 nm, and absorption of the blue zincblende quantum dots increased with increasing concentration (wt %) of the blue zincblende quantum dots when measured by UV-visible spectroscopy. In the case of the green zincblende quantum dots, PL was 530 nm, FWHM was 39 nm, and photoluminescence-quantum yield (PL-QY) was 85% or more.

Referring to FIG. 4C, the red zincblende quantum dots absorbed light having wavelengths of 300 to 650 nm, and absorption of the blue zincblende quantum dots increased with increasing concentration (wt %) of the blue zincblende quantum dots when measured by UV-visible spectroscopy. In the case of the red zincblende quantum dots, PL was 623 nm, FWHM was 42 nm, and photoluminescence-quantum yield (PL-QY) was 73% or more.

Figure 5:
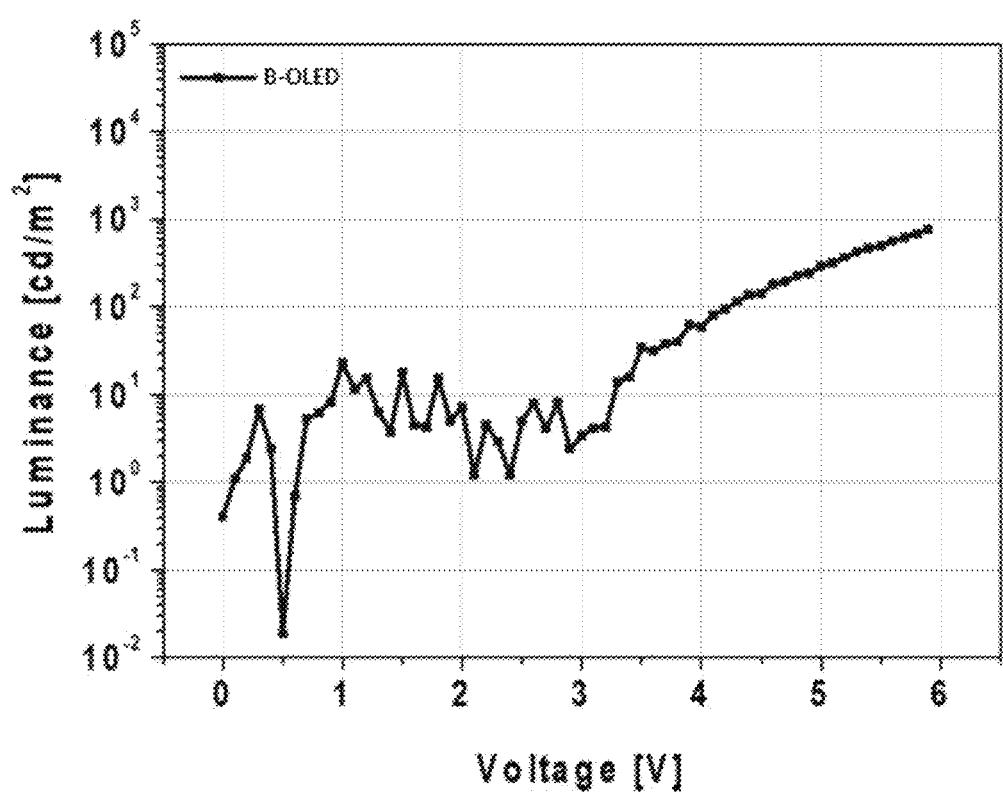
FIG. 5 illustrates a voltage-dependent luminance-voltage (L-V) curve graph of blue OLED (B-OLED).
Figure 6:
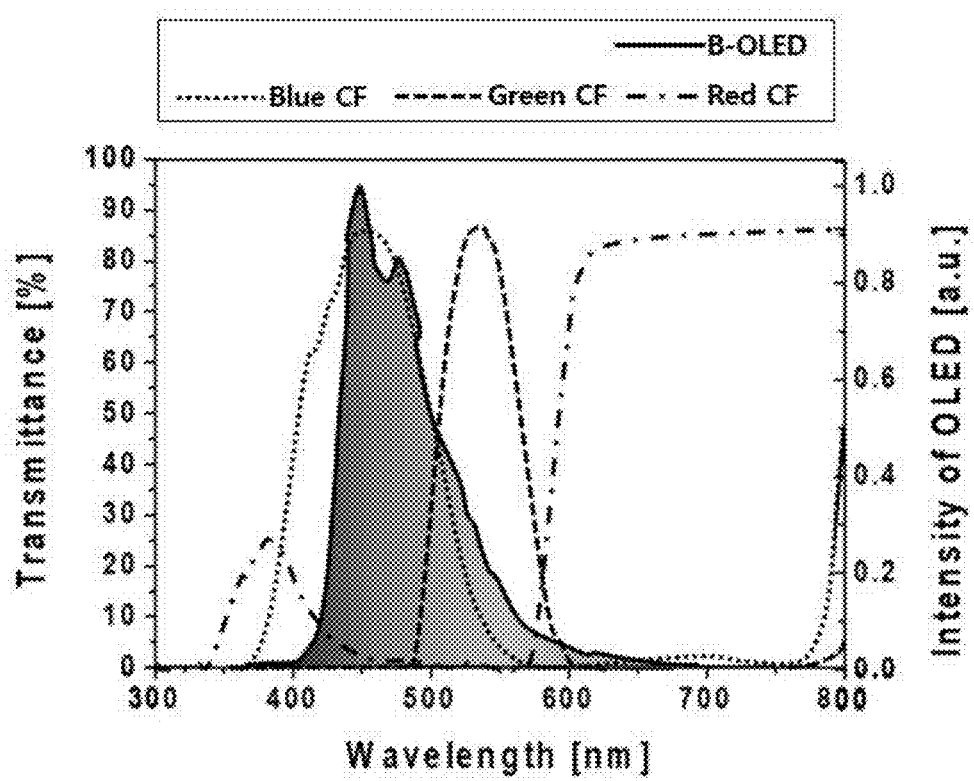
FIG. 6 illustrates photoluminescence spectrum (PL spectrum) of a blue OLED and transmittance spectra of a blue color filter (Blue CF), green color filter (Green CF) and red color filter (Red CF) excluding quantum dots.

FIG. 5 illustrates a voltage-dependent luminance-voltage (L-V) curve graph of blue OLED (B-OLED) according to an embodiment of the present invention, and FIG. 6 illustrates photoluminescence spectrum (PL spectrum) of a blue OLED and transmittance spectra of a blue color filter (Blue CF), green color filter (Green CF) and red color filter (Red CF) excluding quantum dots.

Referring to FIG. 5, it can be confirmed that the luminance of the blue OLED (B-OLED) increases with increasing voltage. Referring to FIG. 6, it can be confirmed that blue, green and red color filters (Blue CF, Green CF, Red CF) excluding quantum dots respectively exhibit transmittance spectra of 371 to 563 nm, 478 to 589 nm and 570 nm or higher and transmittance spectrum peaks of 451 nm, 527 nm and 631 nm or higher. It can be confirmed that, in a photoluminescence spectrum of the blue OLED, a blue light peak of 440 nm and an FWHM of 67 nm are exhibited.

Figure 7:
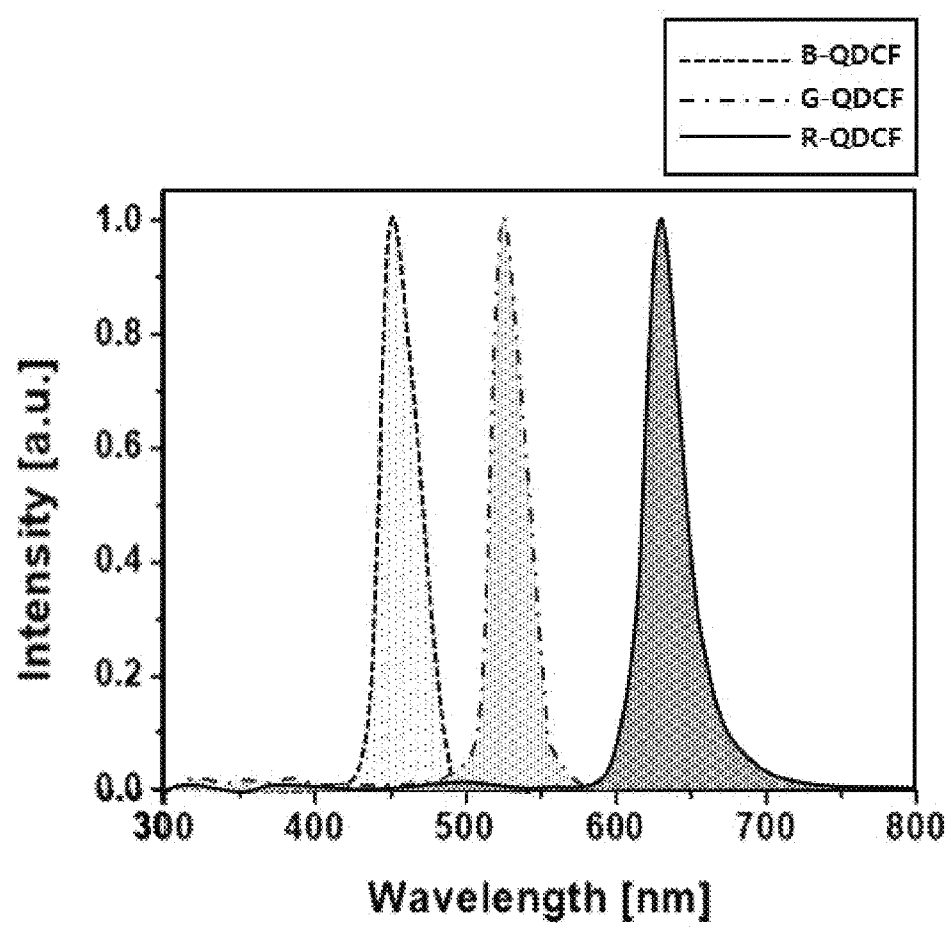
FIG. 7 illustrates photoluminescence spectra of organic liquid crystal display devices (QDCF/B-OLED) that include blue, green and red color filters (B-QDCF, G-QDCF, R-QDCF) including zincblende quantum dots according to embodiments of the present invention.

FIG. 7 illustrates photoluminescence spectra of organic liquid crystal display devices (QDCF/B-OLED) that include blue, green and red color filters (B-QDCF, G-QDCF, R-QDCF) including zincblende quantum dots according to embodiments of the present invention.

Figure 8A:
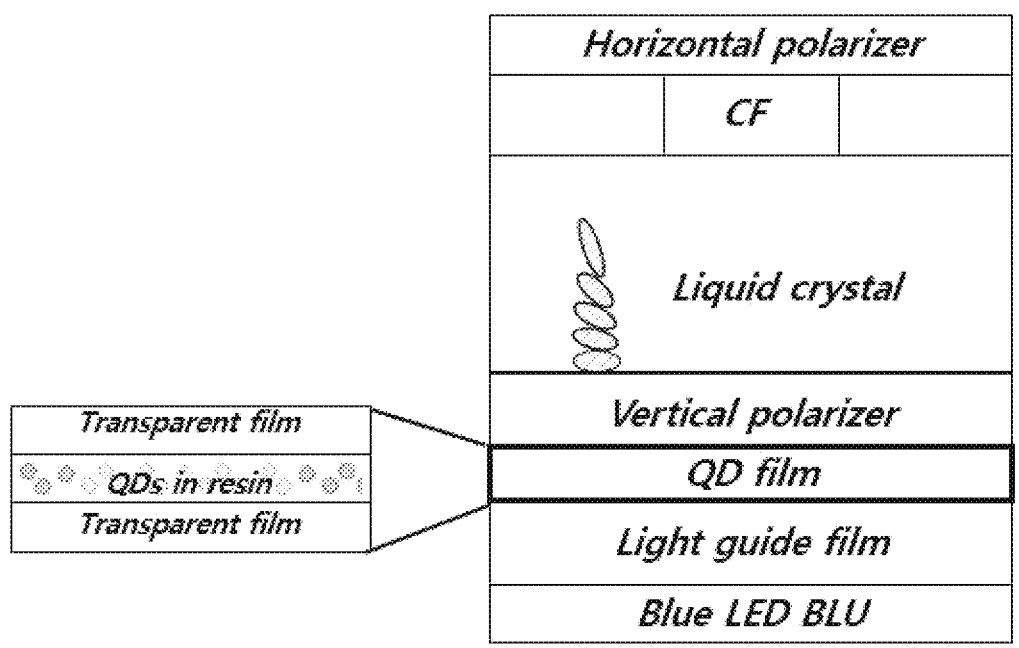
FIG. 8A illustrates a block diagram of a liquid crystal display device (QLED/B-LED) including a blue LED backlight and blue, green and red quantum dots-improving resin films (B-PrQDEF, G-PrQDEF, R-PrQDEF).
Figure 8B:
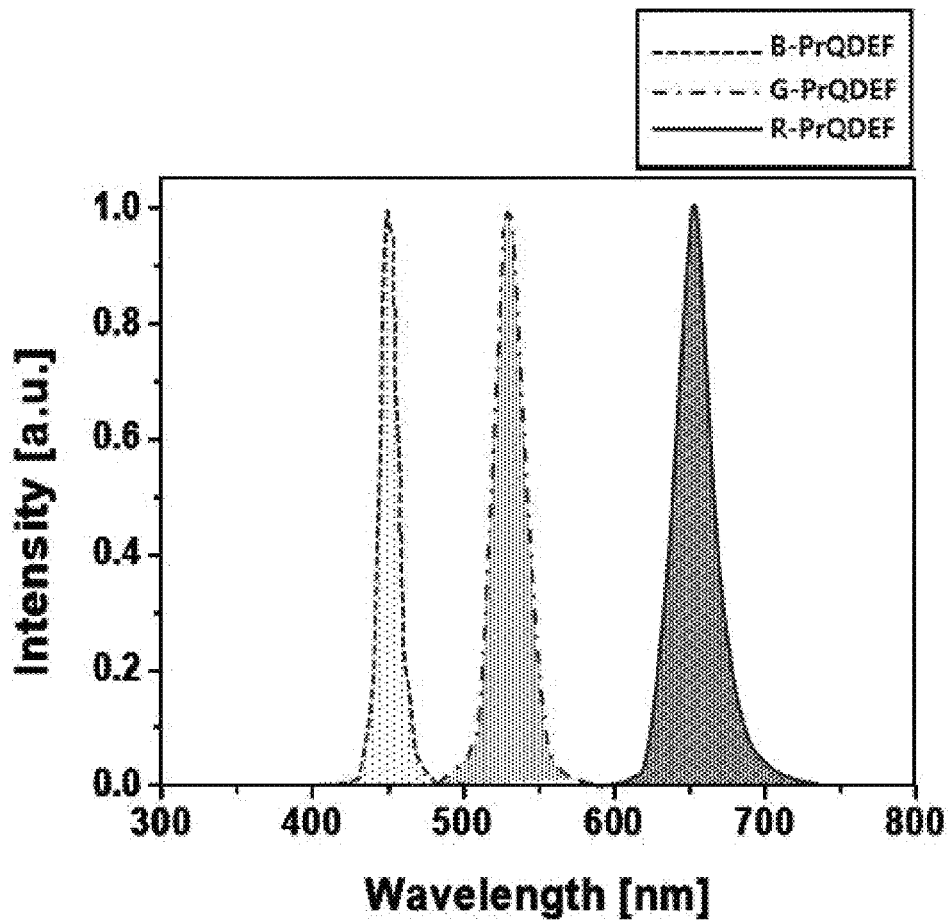
FIG. 8B illustrates photoluminescence spectra of a liquid crystal display device (QLED/B-LED) including a blue LED backlight and blue, green and red quantum dots-improving resin films (B-PrQDEF, G-PrQDEF, R-PrQDEF).

FIG. 8A illustrates a block diagram of a liquid crystal display device (QLED/B-LED) including a blue LED backlight and blue, green and red quantum dots-improving resin films (B-PrQDEF, G-PrQDEF, R-PrQDEF), and FIG. 8B illustrates photoluminescence spectra of a liquid crystal display device (QLED/B-LED) including a blue LED backlight and blue, green and red quantum dots-improving resin films (B-PrQDEF, G-PrQDEF, R-PrQDEF).

Results of FIGS. 7 and 8B are summarized in Table 1 below.

TABLE 1

| Sample | Organic light-emitting display device according to embodiment of present invention (QDCF/B-OLED) | | | Liquid crystal display device including blue LED backlight and quantum dots-improving resin films (QLED/B-LED) | | |
| --- | --- | --- | --- | --- | --- | --- |
| | Blue | Green | Red | Blue | Green | Red |
| PL peak WL [nm] | 447 | 530 | 632 | 452 | 530 | 652 |
| FWHM [nm] | 28.9 | 23.2 | 30.5 | 20.4 | 23.8 | 28.1 |
| PL crosstalk [nm] | No crosstalk | | | No crosstalk | | |

Referring to FIGS. 7 and 8B and Table 1, in the case of the liquid crystal display device (QLED/B-LED) including a blue LED backlight and blue, green and red quantum dots-improving resin films (B-PrQDEF, G-PrQDEF, R-PrQDEF), a film formation process was performed using a resin to form a quantum dots-improving film (QDEF). The resin used for the film formation has a transmittance, which caused ~10% energy loss in the blue backlight light source. On the other hand, the organic light-emitting display device according to an embodiment of the present invention (QDCF/B-OLED) excludes a film formation process and thus excludes a resin, thereby being capable of addressing light source energy loss due to a resin.

Figure 9A:
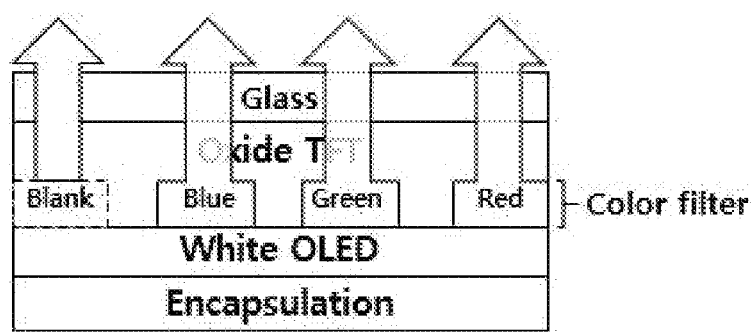
FIG. 9A illustrates a block diagram of an organic light-emitting display device (QDCF/W-OLED) including a white OLED backlight and color filters including quantum dots (RGB-QDCF).
Figure 9B:
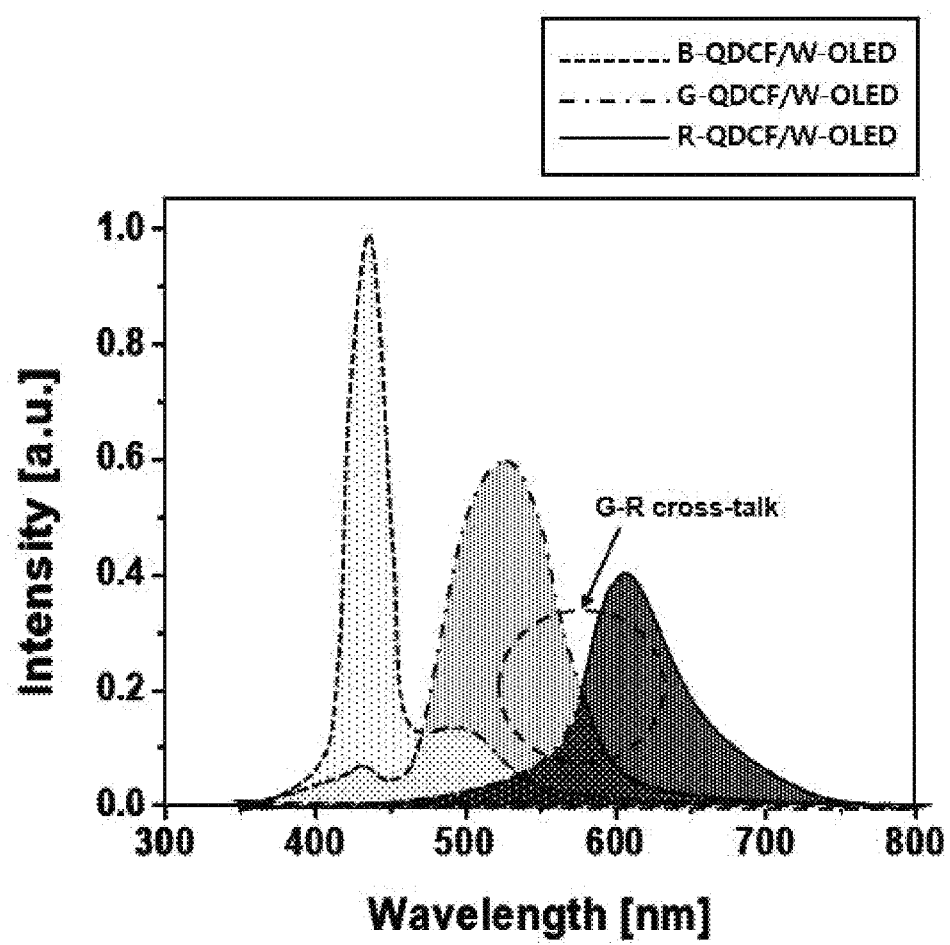
FIG. 9B illustrates photoluminescence spectra of an organic light-emitting display device (QDCF/W-OLED) that includes a white OLED backlight and color filters including quantum dots (RGB-QDCF).

FIG. 9A illustrates a block diagram of an organic light-emitting display device (QDCF/W-OLED) including a white OLED backlight and color filters including quantum dots (RGB-QDCF), and FIG. 9B illustrates photoluminescence spectra of an organic light-emitting display device (QDCF/W-OLED) that includes a white OLED backlight and color filters including quantum dots (RGB-QDCF). Results of FIG. 7 and FIG. 9B are summarized in Table 2 below.

TABLE 2

| Sample | Organic light-emitting display device according to embodiment of present invention (QDCF/B-OLED) | | | Organic light-emitting display device including white OLED backlight and quantum dots-improving resin films (QDCF/W-OLED) | | |
|---|---|---|---|---|---|---|
| | Blue | Green | Red | Blue | Green | Red |
| PL peak WL [nm] | 447 | 530 | 632 | 440~450 | 520~540 | 610~630 |
| FWHM [nm] | 28.9 | 23.2 | 30.5 | 30~40 | 50~60 | 60~70 |
| PL crosstalk [nm] | | No crosstalk | | | >50 nm (green and red) | |

Referring to FIGS. 7 and 9B and Table 2, it can be confirmed that, in the case of the organic light-emitting display device (QDCF/W-OLED) that included a white OLED backlight and color filters including quantum dots (RGB-QDCF), crosstalk of greater than 50 nm occurred in green and red. Particularly, since the white OLED backlight had a blue peak and a yellow peak and the spectrum energy of the yellow peak was broad, G-R crosstalk finally occurred in broad peak spectra of green and red, resulting in color reproducibility decrease.

Figure 10:
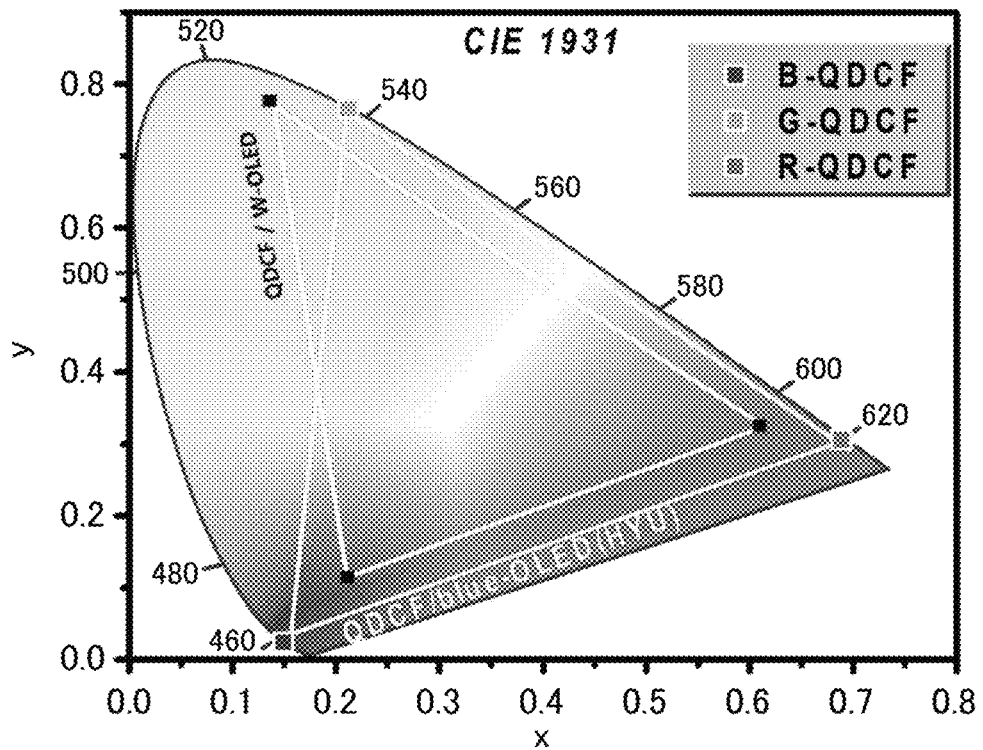
FIG. 10 illustrates CIE 1931 color spaces of the organic light-emitting display device (QDCF/blue-OLED) of FIG. 7 and the organic light-emitting display device of FIG. 9.

FIG. 10 illustrates CIE 1931 color spaces of the organic light-emitting display device (QDCF/blue-OLED) of FIG. 7 and the organic light-emitting display device (QDCF/W-OLED) of FIG. 9B.

Referring to FIG. 10, in the case of the blue OLED backlight in the organic light-emitting display device according to an embodiment of the present invention (QDCF/blue-OLED), an energy-down shift concept wherein each of RGB quantum dots absorbs a blue light source to emit RGB was applied. On the other hand, in the case of the white OLED backlight in the organic light-emitting display device (QDCF/W-OLED) that included a white OLED backlight and color filters including quantum dots (RGB-QDCF), red quantum dots could absorb energy in blue and yellow energy bands, but energy absorption regions of green and blue quantum dots were reduced, which caused backlight light source loss.

Figure 11A:
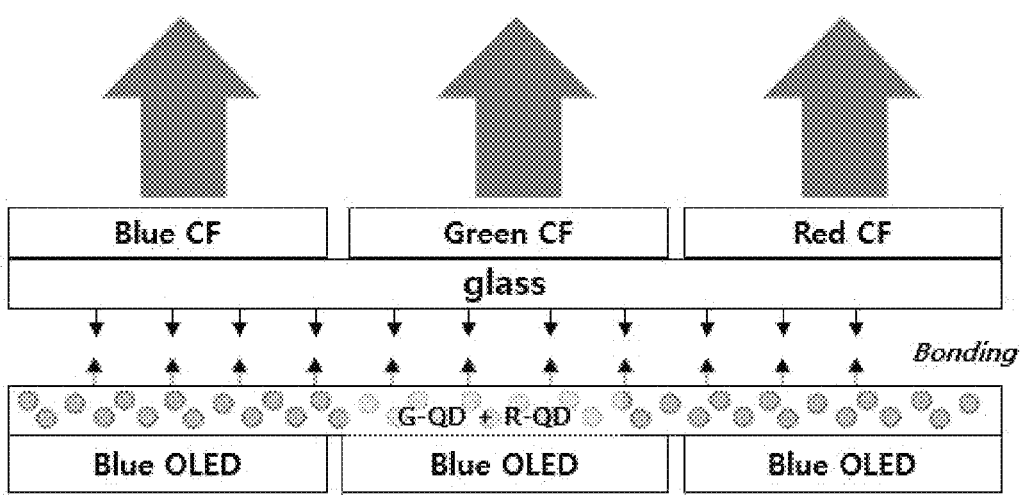
FIG. 11A illustrates a block diagram of an organic liquid crystal display device (RG-QDEF+RGB CF/B-OLED (without blue QD)) including a blue OLED backlight and blue, green and red quantum dots-improving films (B-CF, QDEF+G-CF, QDEF+R-CF).
Figure 11B:
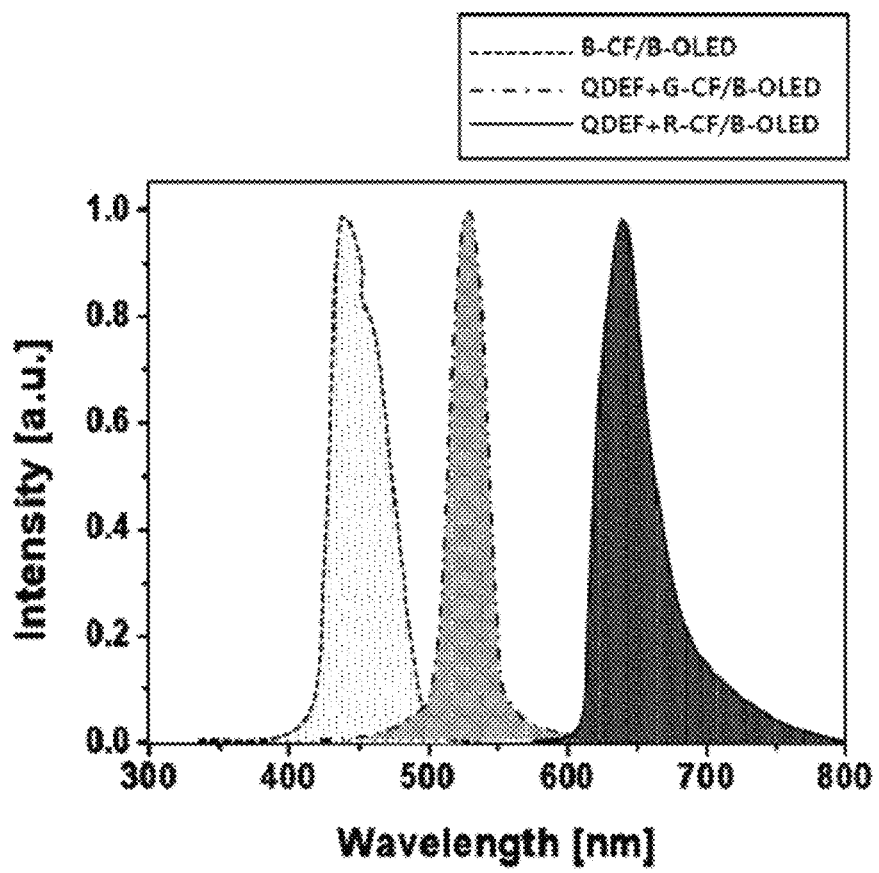
FIG. 11B illustrates photoluminescence spectra of an organic liquid crystal display device (RG-QDEF+RGB CF/B-OLED (without blue QD)) including a blue OLED backlight and green and red quantum dots-improving films (B-CF, QDEF+G-CF, QDEF+R-CF).
Figure 12:
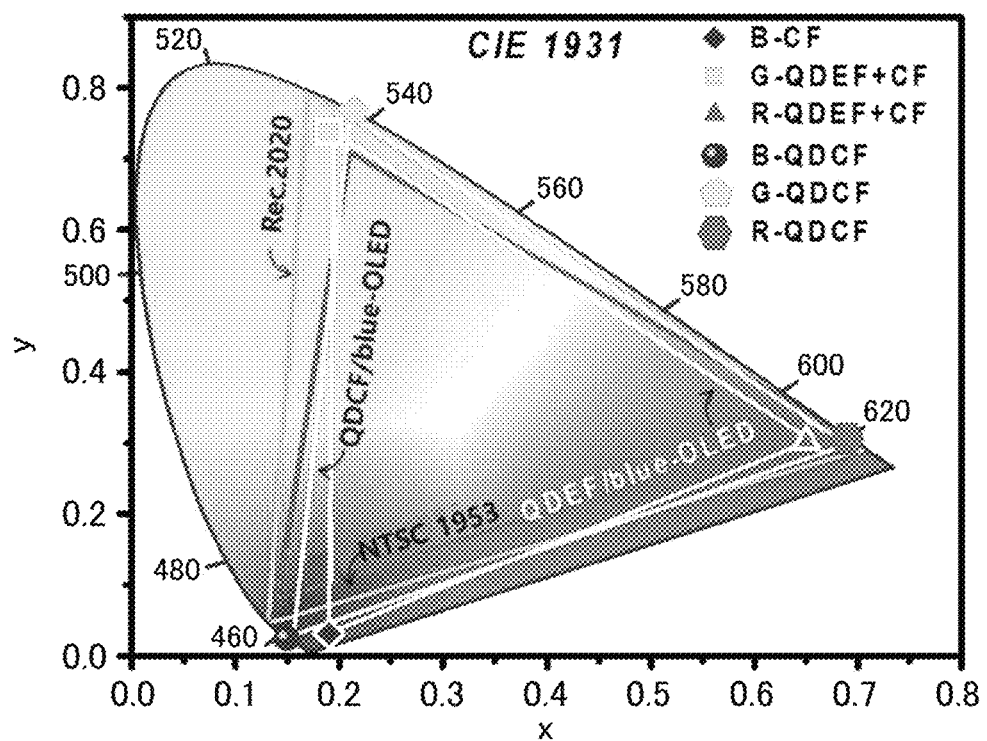
FIG. 12 illustrates CIE 1931 color spaces (CIE 1931 color space) of organic light-emitting display devices (QDEF/blue-OLED) including a blue OLED and green and red quantum dots-improving films; and an organic light-emitting display device (QDCF/blue-OLEE) that includes color filters including zincblende quantum dots according to an embodiment of the present invention.

FIG. 11A illustrates a block diagram of an organic liquid crystal display device (RG-QDEF+RGB CF/B-OLED (without blue QD)) including a blue OLED backlight and green and red quantum dots-improving films (B-CF, QDEF+G-CF, QDEF+R-CF), FIG. 11B illustrates a photoluminescence spectrum of an organic liquid crystal display device (RG-QDEF+RGB CF/B-OLED (without blue QD)) including a blue OLED backlight and green and red quantum dots-improving films (B-CF, QDEF+G-CF, QDEF+R-CF), and FIG. 12 illustrates CIE 1931 color spaces of an organic light-emitting display device (RG-QDEF/blue-OLED, organic liquid crystal display devices (RG-QDEF+RGB CF/B-OLED (without blue QD) of FIGS. 11A and 11B) including a blue OLED and green and red quantum dots-improving films and an organic light-emitting display device (QDCF/blue-OLEE) including color filters including zincblende quantum dots according to an embodiment of the present invention.

FIG. 11A illustrates a block diagram of an organic liquid crystal display device (RG-QDEF+RGB CF/B-OLED (without blue QD)) including a blue OLED backlight and green and red quantum dots-improving films (B-CF, QDEF+G-CF, QDEF+R-CF), FIG. 11B illustrates photoluminescence spectra of an organic liquid crystal display device (RG-QDEF+RGB CF/B-OLED (without blue QD)) including a blue OLED backlight and green and red quantum dots-improving films (B-CF, QDEF+G-CF, QDEF+R-CF), and FIG. 12 illustrates CIE 1931 color spaces (CIE 1931 color space) of organic light-emitting display devices (QDEF/blue-OLED, organic liquid crystal display devices of FIGS. 11A and 11B (RG-QDEF+RGB CF/B-OLED (without blue QD))) including a blue OLED and green and red quantum dots-improving films; and an organic light-emitting display device (QDCF/blue-OLEE) that includes color filters including zincblende quantum dots according to an embodiment of the present invention.

Results of FIGS. 7, 11B and 12 are summarized in Table 3 below.

TABLE 3

| | Organic light-emitting display device according to embodiment of present invention (QDCF/B-OLED) | | | Organic light-emitting display device including quantum dots-improving films (RG-QDEF + RGB-CF/B-OLED) | | |
|---|---|---|---|---|---|---|
| Sample | Blue | Green | Red | Blue | Green | Red |
| PL peak WL [nm] | 447 | 530 | 632 | 440 | 529 | 639 |
| FWHM [nm] | 28.9 | 23.2 | 30.5 | 44.7 | 25.3 | 37.1 |
| CIE coordinates {x, y} | (0.15, 0.02) | (0.21, 0.76) | (0.69, 0.30) | (0.19, 0.03) | (0.18, 0.74) | (0.65, 0.30) |
| PL crosstalk [nm] | | No crosstalk | | | 37(blue-green) | |
| Color gamut NTSC | | 120.8% | | | 108.8% | |
| Rec.2020 | | 90.4% | | | 81.4% | |

Referring to FIGS. 7, 11B, and 12 and Table 3, in the case of the organic light-emitting display device (RG-QDEF+RGB CF/B-OLED) including a quantum dots-improving film, crosstalk of 37 nm occurred in blue and green. On the other hand, crosstalk did not occur in the organic light-emitting display device according to an embodiment of the present invention (RGB-QDCF/B-OLEE). In addition, it can be confirmed that the organic light-emitting display device according to an embodiment of the present invention (RGB-QDCF/B-OLEE) has excellent color reproducibility of 120.8% (NTSC) and 90.4% (Rec. 2020).

DESCRIPTION OF SYMBOLS

110: lower substrate
120: organic light-emitting element
130: color filter layer
140: upper substrate
150: polarizing layer

The invention claimed is:

1. An organic light-emitting display device, comprising:
a lower substrate comprising a driving transistor formed on a surface thereof;
an organic light-emitting element interlocked with the driving transistor; and
an RGB color filter layer formed on the organic light-emitting element and provided with core-shell structured quantum dots that absorb light and emit the absorbed light in a form of visible light in a specific wavelength range,
wherein each of the core-shell structured quantum dots is configured such that the structure thereof is configured to be controlled by the composition thereof,
wherein the organic light emitting element is a blue organic light emitting diode,
wherein the RGB color filter layer includes: a red color filter including first core-shell structured quantum dots, of the core-shell structured quantum dots. emitting red light; and a green color filter having second core-shell structured quantum dots, of the core-shell structured quantum dots, emitting green light; and a blue color filter including third core-shell structured quantum dots, of the core-shell structured quantum dots, emitting blue light, and
wherein a core material of each of the first core-shell structured quantum dots is composed of one or more of group 13 and group 15 elements,
wherein the first second and third core-shell structured quantum dots each contain ligands on their surface,
wherein the ligands are perfluorooctanoic acid (PFOA),
wherein the first core-shell structured quantum dots have a core/shell structure of InP/ZnSe/ZnS: and
wherein the second core-shell structured quantum dots have a core/shell structure of InP/ZnSe/ZnSeS/ZnS.

2. The organic light-emitting display device according to claim 1, wherein the core-shell structured quantum dots energy-down-shift light incident from the organic light emitting element.

3. The organic light-emitting display device according to claim 1, wherein the third core-shell structured quantum dots comprise a zincblende structure.

4. The organic light-emitting display device according to claim 1, wherein an absorption of the RGB color filter layer is adjusted according to a concentration of the core-shell structured quantum dots.

* * * * *